US008886479B2

(12) United States Patent
Matsumoto

(10) Patent No.: US 8,886,479 B2
(45) Date of Patent: Nov. 11, 2014

(54) CHARGE STATE DETECTING DEVICE FOR BATTERY PACK AND METHOD FOR DETECTING CHARGE STATE

(75) Inventor: Junichi Matsumoto, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 475 days.

(21) Appl. No.: 13/394,101

(22) PCT Filed: Sep. 3, 2009

(86) PCT No.: PCT/JP2009/065418
§ 371 (c)(1),
(2), (4) Date: Mar. 2, 2012

(87) PCT Pub. No.: WO2011/027449
PCT Pub. Date: Mar. 10, 2011

(65) Prior Publication Data
US 2012/0173179 A1    Jul. 5, 2012

(51) Int. Cl.
*B60L 11/12* (2006.01)
*G01R 31/36* (2006.01)
*B60L 11/14* (2006.01)
*B60L 11/18* (2006.01)
*H01M 10/42* (2006.01)

(52) U.S. Cl.
CPC ......... *G01R 31/3658* (2013.01); *Y02T 10/7005* (2013.01); *Y02T 10/7077* (2013.01); *Y02T 10/705* (2013.01); *B60L 11/123* (2013.01); *G01R 31/362* (2013.01); *B60L 2240/547* (2013.01); *B60L 2260/44* (2013.01); *G01R 31/3648* (2013.01); *B60L 11/14* (2013.01); *H01M 10/42* (2013.01); *Y02T 10/7044* (2013.01); *B60L 11/1864* (2013.01); *Y02T 10/6217* (2013.01); *B60L 2240/545* (2013.01); *B60L 2240/549* (2013.01)
USPC .............. 702/63; 320/150; 320/132; 320/106

(58) Field of Classification Search
CPC .............. B60L 11/123; B60L 11/1861; B60L 2240/547; B60L 2260/44; B60L 11/3648; B60L 11/14; B60L 2240/545; B60L 2240/549
USPC ............ 702/63; 320/120, 150, 134, 132, 128, 320/136, 106, 118; 324/426
See application file for complete search history.

(56) References Cited

U.S. PATENT DOCUMENTS 4,433,278 A * 2/1984 Lowndes et al. .............. 320/116
5,825,155 A * 10/1998 Ito et al. ........................ 320/118
(Continued)

FOREIGN PATENT DOCUMENTS

| JP | 11-185823 A | 7/1999 |
| JP | 3533076 B2 | 5/2004 |

(Continued)

OTHER PUBLICATIONS

International Search Report of PCT/JP2009/065418 dated Dec. 8, 2009.

*Primary Examiner* — Carol S Tsai
(74) *Attorney, Agent, or Firm* — Sughrue Mion, PLLC

(57) ABSTRACT

A total SOC of a battery pack including a collection of a plurality of battery blocks is calculated based on a plurality of block SOCs representing respective stored charge amounts in the plurality of battery blocks. In the case where a block SOC maximum value is higher than a control upper limit value, the total SOC is calculated to be higher than the control upper limit value. On the other hand, in the case where a block SOC minimum value is lower than a control lower limit value, the total SOC is calculated to be lower than the control upper limit value. Further, in the case where each of the block SOCs is in a range of not less than the control lower limit value and not more than the control upper limit value, the total SOC is determined to fall within the range of not less than the control lower limit value and not more than the control upper limit value.

8 Claims, 6 Drawing Sheets

(56) References Cited

U.S. PATENT DOCUMENTS

| | | | |
|---|---|---|---|
| 5,903,131 A * | 5/1999 | Sekine et al. | 320/106 |
| 6,025,695 A * | 2/2000 | Friel et al. | 320/106 |
| 6,060,864 A * | 5/2000 | Ito et al. | 320/136 |
| 6,064,179 A * | 5/2000 | Ito et al. | 320/128 |
| 6,104,166 A * | 8/2000 | Kikuchi et al. | 320/132 |
| 7,339,351 B2 * | 3/2008 | Murakami et al. | 320/132 |
| 7,633,265 B2 * | 12/2009 | Matsushima et al. | 320/134 |
| 8,203,314 B2 * | 6/2012 | Odaohhara | 320/150 |
| 8,384,353 B2 * | 2/2013 | Miyazaki et al. | 320/120 |
| 2005/0017725 A1 * | 1/2005 | Murakami et al. | 324/426 |
| 2006/0152195 A1 | 7/2006 | Ishishita | |
| 2007/0145949 A1 * | 6/2007 | Matsushima et al. | 320/132 |
| 2009/0033282 A1 | 2/2009 | Ishikawa et al. | |
| 2009/0085527 A1 * | 4/2009 | Odaohhara | 320/150 |

FOREIGN PATENT DOCUMENTS

| | | |
|---|---|---|
| JP | 2005-051921 A | 2/2005 |
| JP | 2009-038857 A | 2/2009 |

* cited by examiner

CHARGE STATE DETECTING DEVICE FOR BATTERY PACK AND METHOD FOR DETECTING CHARGE STATE

CROSS REFERENCE TO RELATED APPLICATIONS

This application is a National Stage of International Application No. PCT/JP2009/065418 filed Sep. 3, 2009, the contents of all of which are incorporated herein by reference in their entirety.

TECHNICAL FIELD

The present invention relates to a charge state detecting device for a battery pack and a method for detecting a charge state, more particularly, a technique for precisely detecting a charge state of an entire battery pack including a plurality of battery cells connected to one another in series.

BACKGROUND ART

An electrically powered vehicle utilizing a motor to generate vehicle driving force, such as an electric vehicle, a hybrid vehicle, or a fuel cell vehicle, has a secondary battery (hereinafter, also simply referred to as "battery"). The secondary battery stores electric power to drive the motor. In the electrically powered vehicle, during reduction of speed, regenerative braking force is generated by the motor, thereby providing regenerative power generation to charge the secondary battery with the resulting electric power.

Thus, the secondary battery mounted on the electrically powered vehicle is repeatedly charged and discharged during vehicle traveling. Accordingly, during the vehicle traveling, it is important to control an amount of charge stored in the secondary battery. As an amount of state representing the amount of stored charge, SOC (State Of Charge) has been used conventionally. The SOC is represented by a ratio of the amount of stored charge at present to the amount of stored charge in the fully charged state. In the fully charged state, SOC=100(%). In a state in which the secondary battery is not changed at all, SOC=0(%).

Normally, with SOC=approximately 50-60(%) being a control objective, the secondary battery is controlled to be charged and discharged during the traveling such that the SOC falls within a range of a control lower limit value (for example, 30(%)) to a control upper limit value (for example, 80(%)). Specifically, when the SOC comes close to the control lower limit value, the vehicle is controlled to urge charging of the secondary battery. As one example, in a hybrid vehicle, a power generator is operated using an output of an internal combustion engine, thereby generating electric power for charging the secondary battery. On the other hand, when the SOC comes close to the control upper limit value, the vehicle is controlled to limit or prohibit regenerative braking.

Meanwhile, in the electrically powered vehicle, a battery pack is generally used to obtain a high output voltage. The battery pack has a multiplicity of battery cells connected to one another in series. However, in such a battery pack, temperature is not uniform among the cells. Particularly in an operating environment such as that in a vehicle, a temperature difference is relatively likely to take place between the cells. As a result, charging efficiency and full charging capacity differ among the cells, which leads to variation of actual SOCs among the cells constituting the battery pack.

In view of this, Japanese Patent No. 3533076 (PTL 1) describes a technique for precisely detecting a state of charge stored in the entire battery pack even when the SOC variation becomes large among the cells constituting the battery pack.

In Japanese Patent No. 3533076 (PTL 1), the battery pack is divided into a plurality of battery blocks. Variation in the amounts of stored charge among the battery blocks is detected. Then, based on a value of the detected variation and the upper and lower limit values of the amounts of stored charge in the battery blocks, a movable range for the amounts of stored charge is determined. Then, an amount (N-SOC) of stored charge in the entire battery pack is defined in accordance with a positional relation of the state of charge stored in each of the plurality of battery blocks at present relative to this movable range.

CITATION LIST

Patent Literature

PTL 1: Japanese Patent No. 3533076

SUMMARY OF INVENTION

Technical Problem

In Japanese Patent No. 3533076 (PTL 1), the state of stored charge is detected based on the detection of the variation in the amounts of stored charge among the battery blocks. In other words, a feature of Japanese Patent No. 3533076 lies in that the amount of stored charge in the entire battery pack is set based on the value of the detected variation so as to achieve control that maximally utilizes the actual movable range under the present circumstance.

Here, with reference to FIG. 12, a relation between the SOC and the voltage (open circuit voltage) of the secondary battery will be described. Referring to FIG. 12, the secondary battery is roughly classified into two types based on an SOC-voltage characteristic. Specifically, there are the following types of secondary batteries: a secondary battery (representatively, nickel-hydrogen battery) of a type in which the voltage (open circuit voltage) relative to the SOC is constant in a wide range as indicated by a reference character 500; and a secondary battery (representatively, lithium ion battery) of a type in which the voltage is changed gradually in a uniform manner in response to a change of SOC across the entire region of the SOC as indicated by a reference character 510.

Japanese Patent No. 3533076 (PTL 1) is representatively applied to the nickel-hydrogen battery. Namely, in view of the above-described SOC-voltage characteristic, Japanese Patent No. 3533076 (PTL 1) is based on such a premise that from abrupt change of voltage in any of the battery blocks, it is detected that an SOC falls below the lower limit value (corresponding to S1 in FIG. 12) or exceeds the upper limit value (corresponding to S2 in FIG. 12) in the battery block (described as "IV determination" in PTL 1). In accordance with this IV determination, the variation in the amounts of stored charge is calculated based on a value of currents integrated during a period from time at which it is detected that the lowest value of the SOCs among the plurality of battery blocks has reached the lower limit value, to time at which the maximum value of the SOCs among the plurality of battery blocks reaches the upper limit value. From the value of the detected variation, the amount (N-SOC) of stored charge in the entire battery pack is determined.

However, in the secondary battery having the characteristic represented by reference character 510 in FIG. 12 such as a lithium ion battery, there is no SOC region in which voltage behavior is abruptly changed in response to a change of SOC. Hence, there is no room for the IV determination of Japanese Patent No. 3533076 (PTL 1). Thus, it is difficult to apply the detection of the state of stored charge in Japanese Patent No. 3533076 (PTL 1) to the secondary battery having the characteristic represented by reference character 510 in FIG. 12 such as the lithium ion battery, without any modification.

In order to solve the foregoing problem, the present invention has been made to precisely set a total SOC for a battery pack in a reflection of variation in amounts of stored charge among battery blocks of the battery pack so as to appropriately control charging and discharging of the battery pack, which is constituted by a secondary battery having such a characteristic that voltage is changed in a relatively uniform manner in response to a change in SOC.

Solution to Problem

A charge state detecting device for a battery pack in the present invention is a charge state detecting device for a battery pack having a plurality of battery cells connected to one another in series, and includes a stored charge amount estimating unit and a total stored charge amount setting out unit. The plurality of battery cells are divided into a plurality of battery blocks each having at least one battery cell. The stored charge amount estimating unit is configured to calculate a plurality of stored charge amount estimate values respectively corresponding to the plurality of battery blocks, based on respective state detection values at the plurality of battery blocks. The total stored charge amount setting out unit sets a total stored charge amount estimate value of the battery pack based on the plurality of stored charge amount estimate values. In particular, the total stored charge amount setting unit is configured to: set the total stored charge amount estimate value to be higher than a control upper limit value in a first case where a maximum value of the plurality of stored charge amount estimate values is higher than the control upper limit value; set the total stored charge amount estimate value to be lower than a control lower limit value in a second case where a minimum value of the plurality of stored charge amount estimate values is lower than the control lower limit value; and set the total stored charge amount estimate value at a value within a control range defined to be not less than the control lower limit value and not more than the control upper limit value, based on a distribution of the plurality of stored charge amount estimate values at present in a third case where all of the plurality of stored charge amount estimate values are within the control range.

In a method for detecting a charge state of a battery pack in the present invention, the battery pack has a plurality of battery cells connected to one another in series, and the plurality of battery cells are configured to be divided into a plurality of battery blocks each having at least one battery cell. The method for detecting the charge state includes the steps of: calculating a plurality of stored charge amount estimate values respectively corresponding to the plurality of battery blocks, based on respective state detection values at the plurality of battery blocks; determining a maximum value and a minimum value of the plurality of stored charge amount estimate values; and setting a total stored charge amount estimate value of the battery pack based on the plurality of stored charge amount estimate values. In particular, in the step of setting, the total stored charge amount estimate value is set to be higher than a control upper limit value in a first case where the maximum value is higher than the control upper limit value, the total stored charge amount estimate value is set to be lower than a control lower limit value in a second case (402) where the minimum value is lower than the control lower limit value, and the total stored charge amount estimate value is set at a value within a control range defined to be not less than the control lower limit value and not more than the control upper limit value, based on a distribution of the plurality of stored charge amount estimate values at present in a third case where all of the plurality of stored charge amount estimate values are within the control range.

According to the state detecting device for the battery pack and the method for detecting the state of the battery pack, when the SOC of any of the battery blocks falls out of the control range from the control lower limit value to the control upper limit value, the stored charge amount estimate value (total SOC) of the entire battery pack can be set to exceed the control upper limit value or fall below the control lower limit value, based on the respective stored charge amount estimate values (SOCs) of the plurality of battery blocks. The stored charge amount estimate values are sequentially calculated based on the state detection values. Accordingly, the charging and discharging control can be performed to achieve safety against progress of further overcharging or overdischarging. Namely, the total SOC can be precisely set to prevent charging/discharging or overdischarging, in a reflection of the SOC variation among the battery blocks of the battery pack.

Preferably, in the third case, the total stored charge amount setting unit or the step of setting sets the total stored charge amount estimate value at the control lower limit value in a case where the minimum value is equal to the control lower limit value, and sets the total stored charge amount estimate value at the control upper limit value in a case where the maximum value is equal to the control upper limit value.

In this way, when the SOC of each of the battery blocks is within the control range of the control lower limit value to the control upper limit value, the total SOC can be set within the range of the control lower limit value to the control upper limit value so as to indicate that the SOC of the entire battery pack is within the normal SOC range.

More preferably, the total stored charge amount setting unit is configured to calculate a variation amount in accordance with a difference between the maximum value and the minimum value and is configured to determine a parameter in accordance with a ratio of a second value to a first value, the first value being obtained by subtracting the variation amount from a control width representing a width of the control range, the second value being obtained by subtracting the variation amount and the control width from the maximum value, the parameter indicating where the plurality of stored charge amount estimate values at present are located in the control range, and the total stored charge amount setting unit is configured to set the total stored charge amount estimate value in accordance with a total of a multiplication value of the parameter and the control width and the control lower limit value. Alternatively, the step of determining further determines a variation amount in accordance with a difference between the maximum value and the minimum value. The step of setting includes the steps of: determining a parameter in accordance with a ratio of a second value to a first value, the first value being obtained by subtracting the variation amount from a control width representing a width of the control range, the second value being obtained by subtracting the variation amount and the control width from the maximum value, the parameter indicating where the plurality of stored charge amount estimate values at present are located in the control range; and calculating the total stored charge amount estimate value in accordance with a total of a multiplication value of the parameter and the control width and the control lower limit value.

In this way, by calculating the parameter (a), which indicates where the distribution of the SOCs of the plurality of battery blocks at present is located in the control range, in a reflection of the SOC variation among the battery blocks, there can be quantitatively indicated, with the parameter, the positional relation of the distribution of the SOCs at present relative to the movable range for limiting the charging and discharging of the battery pack to fall within the control range. Because the total SOC is set to indicate the actual movable range at present relative to the control range, the total SOC can be set to exhibit maximum performance of the battery pack without excessively narrowing the movable range by taking the SOC variation among the battery blocks into consideration too much.

Alternatively, preferably, the total stored charge amount setting unit is configured to set the total stored charge amount estimate value in accordance with the maximum value when a variation amount according to a difference between the maximum value and the minimum value is larger than a predetermined value. Alternatively, the step of determining further determines a variation amount in accordance with a difference between the maximum value and the minimum value.

The method for detecting the charge state further includes the step of setting the total stored charge amount estimate value in accordance with the maximum value when the variation amount is larger than a predetermined value.

More preferably, the predetermined value is set at a value obtained by subtracting a predetermined safety margin from the control width.

In this way, when the SOC variation among the battery blocks becomes large and the control range of the control lower limit value to the control upper limit value and the variation amount accordingly become substantially equal to each other, the total SOC of the battery pack can be set to prevent overcharging more preferentially.

Advantageous Effects of Invention

According to the present invention, a total SOC of a battery pack constituted by a secondary battery having such a characteristic that voltage is changed relatively in a uniform manner in response to a change of SOC can be set precisely in a reflection of variation of stored charge amounts among battery blocks of the battery pack at present, so as to precisely control the stored charge amount and charging and discharging of the battery pack.

DESCRIPTION OF EMBODIMENTS

Figure 1:
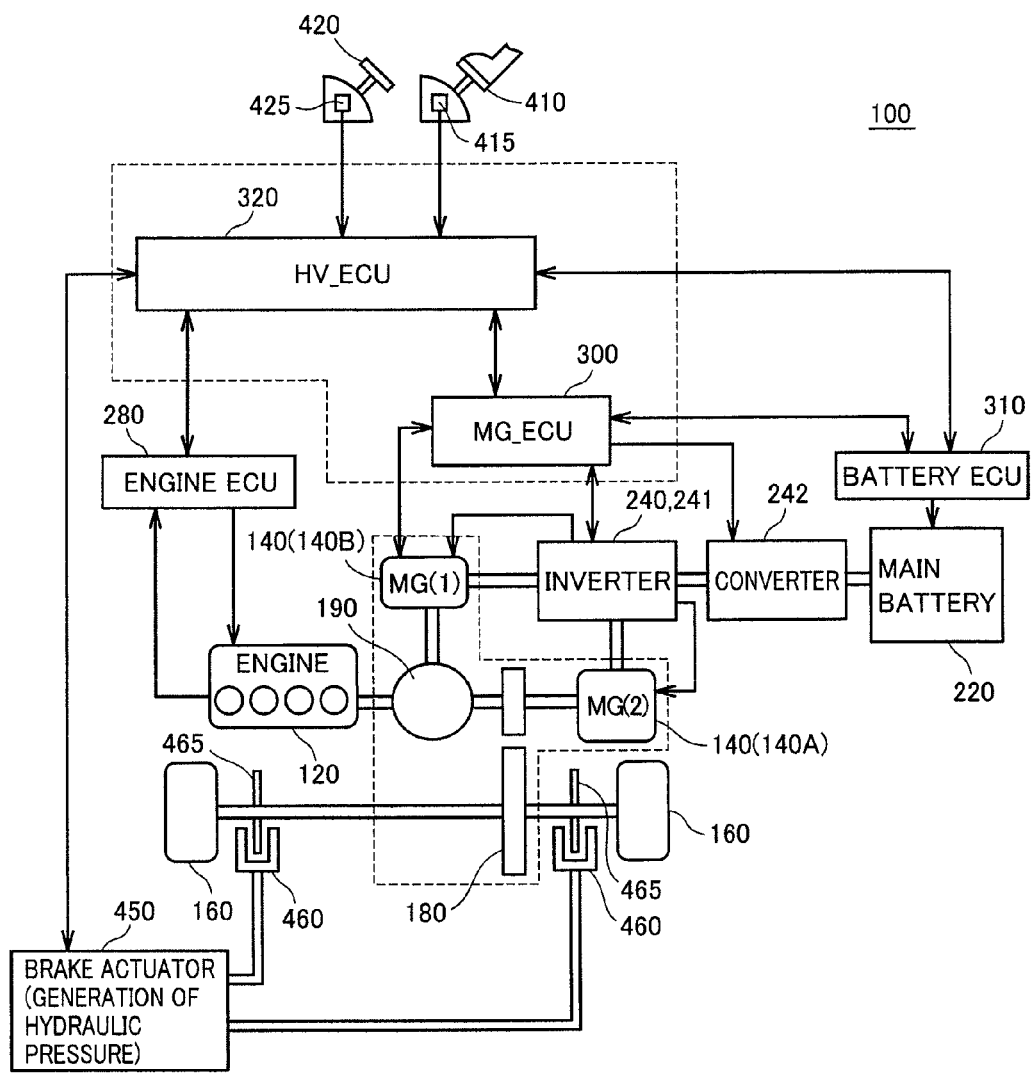
FIG. 1 is a control block diagram showing a hybrid vehicle serving as a representative example of an electrically powered vehicle having a secondary battery to which a charge state detecting device for a battery pack and a method for detecting the charge state in an embodiment of the present invention are applied.

The following describes an embodiment of the present invention in detail with reference to figures. It should be noted that in the figures, the same or corresponding portions are given the same reference characters and are not described repeatedly in principle.

FIG. 1 is a control block diagram of a hybrid vehicle presented as a representative example of an electrically powered vehicle having a secondary battery to which a charge state detecting device for a battery pack and a method for detecting the charge state in the embodiment of the present invention are applied.

Referring to FIG. 1, hybrid vehicle 100 includes an internal combustion engine (hereinafter, simply referred to as "engine") 120 such as a gasoline engine or a diesel engine, and a motor generator (MG) 140, serving as a vehicle driving force generating source. Motor generator 140 includes a motor generator 140A (hereinafter, also simply referred to as "motor 140A" for ease of description) mainly serving as a motor, and a motor generator 140B (hereinafter, also simply referred to as "motor 140B" for ease of description) mainly serving as a generator. It should be noted that motor 140A may operate as a generator and generator 140B may operate as a motor, depending on a traveling state of hybrid vehicle 100.

In addition to these, hybrid vehicle 100 includes: a speed reducer 180 for transmitting to a driving wheel 160 the motive powers generated by engine 120 and motor generator 140A and for transmitting a driving force from driving wheel 160 to engine 120 and motor generator 140A; a power split mechanism (for example, planetary gear mechanism) 190 for distributing the motive power generated by engine 120 into two paths, i.e., driving wheel 160 and generator 140B; a main battery 220 for charging electric power for driving motor generators 140A, 140B; an inverter 240 for controlling current while converting direct current of main battery 220 from/to alternating current of motor generator 140A; and an inverter 241 for controlling current while converting direct current of main battery 220 from/to alternating current of motor generator 140B.

Main battery 220 corresponds to a "battery pack" to which the charge state detecting device for the battery pack and the method for detecting the charge state in the embodiment of the present invention are applied.

Hybrid vehicle 100 further includes: a battery control unit (hereinafter, referred to as battery ECU (Electronic Control Unit)) 310 for managing and controlling charging and discharging of main battery 220; an engine ECU 280 for controlling an operation state of engine 120; an MG_ECU 300 for controlling motor generators 140A, 140B, battery ECU 310, inverter 240, and the like in accordance with a state of the hybrid vehicle; and an HV_ECU 320 for controlling the entire hybrid system by mutually managing and controlling battery ECU 310, engine ECU 280, MG_ECU 300, and the like to operate hybrid vehicle 100 most effectively.

Each of the ECUs is configured to include a CPU (Central Processing Unit) and a memory both not shown in the figures, and to perform arithmetic processing using a detection value supplied from each sensor, based on a map and a program stored in the memory. Alternatively, at least a part of the ECU may be configured to perform predetermined mathematical/logical computations using hardware such as an electronic circuit. In FIG. 1, the ECUs are configured separately but may be configured as an ECU in which two or more ECUs are incorporated (one example of such an ECU is, for example, one having MG_ECU 300 and HV_ECU 320 incorporated therein as indicated by a dotted line in FIG. 1).

An accelerator pedal sensor 415 is connected to accelerator pedal 410 operated by a driver, and generates an output voltage according to a driver-operated amount (pedal angle) of accelerator pedal 410. Likewise, a brake pedal sensor 425 is connected to a brake pedal 420 operated by a driver, and generates an output voltage according to a driver-operated amount (pedaling force) of brake pedal 420. The output voltages of accelerator pedal sensor 415 and brake pedal sensor 425 are sent to HV_ECU 320. Thus, HV_ECU 320 can detect the driver-operated amounts of accelerator pedal 410 and brake pedal 420.

In the present embodiment, a converter 242 is provided between main battery 220 and inverter 240. Accordingly, even when main battery 220 has a rated voltage smaller than those of motor generator 140A and motor generator 140B, converter 242 steps up or down the voltage, whereby electric power can be exchanged between main battery 220 and motor generators 140A, 140B.

As power split mechanism 190, a planetary gear mechanism (planetary gear) is representatively used to distribute the motive power generated by engine 120 to both driving wheel 160 and motor generator 140B. By controlling the rotation speed of motor generator 140B, power split mechanism 190 also serves as a continuously variable transmission. Torque of engine 120 is input to a planetary carrier (C), and is transmitted to motor generator 140B by a sun gear (S) and is transmitted to the motor and an output shaft (the driving wheel 160 side) by a ring gear (R). When stopping engine 120 currently being rotated, kinetic energy resulting from the rotation of engine 120 is converted by motor generator 140B into electric energy to decrease the rotation speed of engine 120.

In hybrid vehicle 100 having the hybrid system mounted thereon as shown in FIG. 1, when engine 120 is poor in efficiency at startup or during slow speed traveling, the hybrid vehicle travels only using motor 140A of motor generator 140. During normal traveling, for example, power split mechanism 190 splits the motive power provided from engine 120 into the two paths, thereby directly driving driving wheel 160 on one hand and driving generator 140B to generate electric power on the other hand. The electric power generated on this occasion is employed to drive motor 140A to assist driving of driving wheel 160. During high speed traveling, electric power is supplied from main battery 220 to motor 140A to increase the output of motor 140A, thus providing additional driving force to driving wheel 160.

Meanwhile, upon deceleration, motor 140A, which operates according to driving wheel 160, serves as a generator to generate electric power through regenerative braking, and the electric power thus recovered can be stored in main battery 220. It should be noted that the regenerative braking herein includes braking involving generation of regenerative power when a driver who drives the hybrid vehicle operates the foot brake, as well as deceleration of the vehicle (or halt of acceleration) by easing off the accelerator pedal during traveling to generate regenerative power without operating the foot brake.

Regenerative power that can be generated is set according to a permissible value (upper limit value) of electric power charged to main battery 220. In other words, while main battery 220 is prohibited from being charged, regenerative power generation is also prohibited and the torque command value of motor generator 140A is set at zero or a positive value.

Further, when an amount of charge in main battery 220 is decreased and main battery 220 therefore particularly needs to be charged, the output of engine 120 is increased to increase an amount of electric power generated by generator 140B. In this way, an amount of charge supplied to main battery 220 is increased. Also during slow speed traveling, the output of engine 120 is controlled to increase when required, for example, when main battery 220 needs to be charged as described above, when driving an auxiliary device such as an air conditioner, when increasing the temperature of coolant in engine 120 to a predetermined temperature, and the like.

Each of driving wheel 160 and wheels not shown in the figures is provided with a brake mechanism 460. Brake mechanism 460 is configured to obtain braking force of the vehicle from friction force generated by pressing a disc rotor 465, which is provided corresponding to each wheel, with a brake pad (friction material) operated by hydraulic pressure generated by brake actuator 450. An amount of hydraulic pressure generated by brake actuator 450 is controlled by HV_ECU 320.

HV_ECU 320 calculates total braking force required by the entire vehicle, from the operated amount of brake pedal 420 and the like. HV_ECU 320 performs control so that the total required braking force thus calculated is generated cooperatively by regenerative braking force provided by motor 140A and hydraulic braking force provided by brake mechanism 460.

Figure 2:
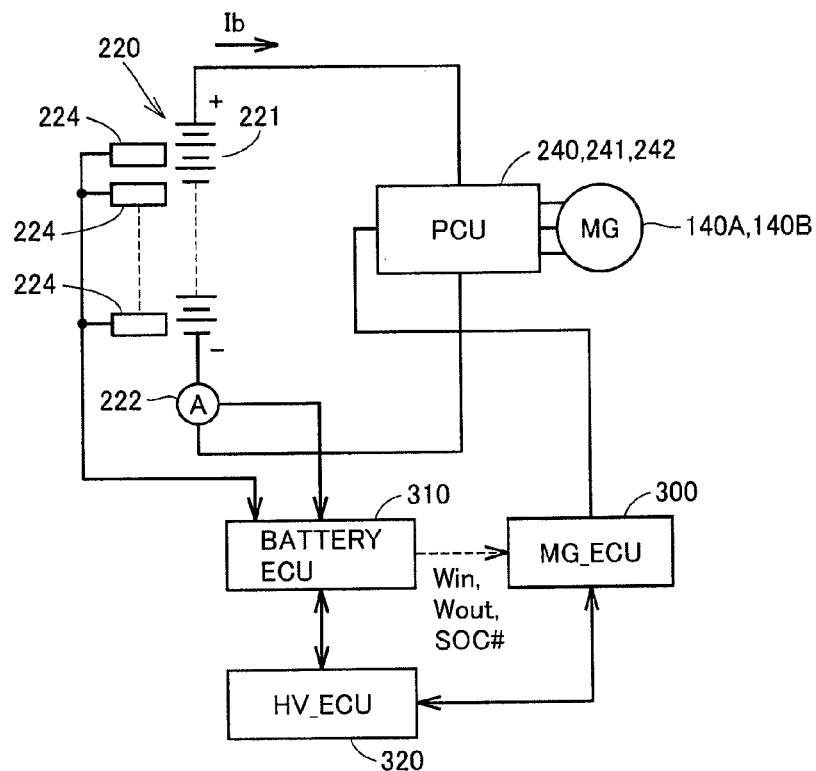
FIG. 2 is a block diagram showing a configuration associated with charging and discharging of the secondary battery of the hybrid vehicle shown in FIG. 1.

FIG. 2 shows a configuration for charging and discharging the secondary battery in the hybrid vehicle shown in FIG. 1.

Referring to FIG. 2, main battery 220 is constituted by a battery pack having a plurality of battery cells 221 connected to one another in series. Main battery 220 is constituted representatively by a lithium ion battery.

Main battery 220 is connected to motor generators 140A, 140B (MG (1), MG (2)) via inverters 240, 241, and converter 242. In other words, in the present embodiment, a PCU (Power Control Unit) made up of inverters 240, 241 and converter 242, as well as motor generators 140A, 140B (MG (1), MG (2)) integrally constitute a "load" of main battery 220.

Further, main battery 220 is provided with a current sensor 222 and a group of sensors 224. Current sensor 222 detects a current flowing in main battery 220. The group of sensors 224 measures an output voltage and a battery temperature for each of battery blocks (described below in detail) constituted by a predetermined number of battery cells 221. These sensors send their outputs to battery ECU 310.

Based on these sensor output values, battery ECU 310 calculates an amount of stored charge (SOC) in the battery and limits charging and discharging of the battery. In particular, battery ECU 310 sets a total SOC (SOC#) for main battery 220 constituted by the plurality of battery cells 221. The total SOC (SOC#) represents an amount of stored charge in the entire battery pack.

Main battery 220 is controlled to be charged and discharged so as to conform the total SOC to a target SOC. Further, to prevent overcharging and overdischarging of main battery 220, battery ECU 310 determines a charging power upper limit value Win (Win≤0) and a discharging power upper limit value Wout (Wout≥0), and sends them to MG_ECU 300 and HV_ECU 320.

For example, charging power upper limit value Win is set to prevent battery voltage Vb from being higher than the maximum permissible voltage (upper limit voltage) or prevent the total SOC from being higher than the control upper limit value, due to overcharging. Likewise, discharging power upper limit value Wout is set to prevent battery voltage Vb from being lower than the minimum permissible voltage (lower limit voltage), or prevent the total SOC from being lower than the control lower limit value, due to overdischarging.

Here, the upper limit voltage and lower limit voltage are determined according to the maximum rated voltage and minimum rated voltage of main battery 220, a voltage allowing for (guaranteeing) operations of the devices (load) connected to main battery 220, or the like. The absolute values of charging/discharging power upper limit values Win, Wout are also varied according to battery temperature Tb, and are kept low when battery temperature Tb is high and low, as compared with those at a normal temperature.

Particularly, HV_ECU 300 sets an operation command value (representatively, torque command value) for each of motor generators 140A, 140B, to charge/discharge main battery 220 within a range between charging power upper limit value Win and discharging power upper limit value Wout. For example, the above-described distribution of the output of the vehicular driving force between engine 120 and motor 140A according to a traveling state is considered so that electric power output from main battery 220 and including electric power to be consumed by motor 140A does not exceed discharging power upper limit value Wout.

Meanwhile, upon regenerative braking, a torque command value (generally, negative torque) for motor generator 140A is set while electric power input to main battery 220 and including electric power generated by motor generator 140A is considered not to exceed charging power upper limit value Win. As described above, when a driver operates the brake, HV_ECU 320 cooperatively controls regenerative braking force provided by motor generator 140A and hydraulic braking force provided by brake mechanism 460 to obtain a total required braking force from the sum of the braking forces. Hence, even though regenerative braking force provided by motor generator 140A is limited or prohibited in accordance with charging power upper limit value Win, a required vehicular braking force can be obtained.

Thus, the total SOC is reflected in charging/discharging power upper limit values Win, Wout. Hence, in order to appropriately control the charging and discharging of main battery 220, it is important to appropriately set the total SOC in consideration of the SOC variation in main battery 220 constituted by the battery pack.

Figure 3:
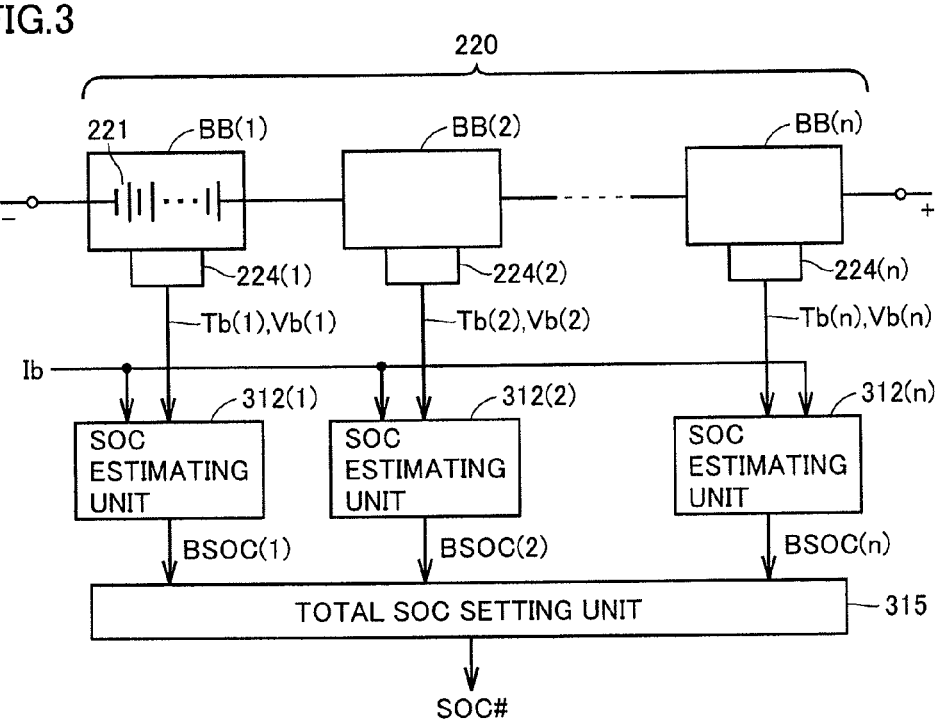
FIG. 3 is a block diagram showing a configuration of the charge state detecting device for the battery pack in the embodiment of the present invention.

FIG. 3 is a block diagram showing a configuration of the charge state detecting device for the battery pack in the embodiment of the present invention.

Referring to FIG. 3, the plurality of battery cells 221 constituting main battery 220 and connected to one another in series are divided into a plurality of battery blocks BB(1)-BB(n) (n: natural number). A group of sensors 224(1)-224(n) are disposed to correspond to battery blocks BB(1)-BB(n), respectively. The group of sensors 224(1)-224(n) respectively detect battery temperatures Tb(1)-Tb(n) and battery voltages Vb(1)-Vb(n) of battery blocks BB(1)-BB(n). Further, current sensor 222 shown in FIG. 2 detects a battery current Ib in the entire battery pack. In the configuration shown in FIG. 3, battery blocks BB(1)-BB(n) are connected to one another in series and battery current Ib therefore has a common value among the battery blocks.

It should be noted that in the description below, battery voltages Vb(1)-Vb(n) are also collectively referred to as "battery voltage Vb" and battery temperatures Tb(1)-Tb(n) are also collectively referred to as "battery temperature Tb". In each of battery blocks BB(1)-BB(n), at least one of the battery voltage (Vb), the battery temperature (Tb), and battery current Ib corresponds to "state detection value" of the battery block.

SOC estimating units 312(1)-312(n) are provided to respectively correspond to battery blocks BB(1)-BB(n). In the description below, SOC estimating units 312(1)-312(n) provided for the respective battery blocks are also simply referred to as "SOC estimating unit 312" when they are illustrated collectively.

Figure 12:
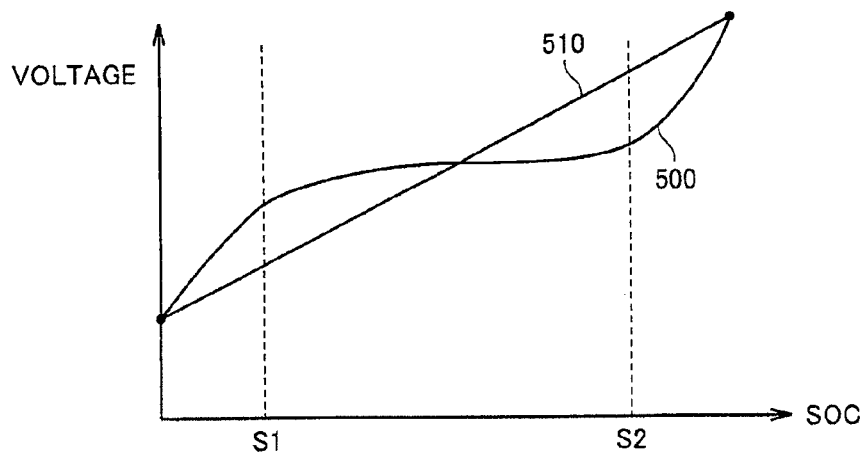
FIG. 12 is a conceptual view showing an SOC-voltage characteristic in a secondary battery.

Each of SOC estimating units 312(1)-312(n) calculates a block SOC based on a state detection value of its corresponding battery block. The block SOC is an SOC estimate value for the battery block. Namely, SOC estimating units 312(1)-312(n) respectively calculate BSOC(1)-BSOC(n) respectively corresponding to battery blocks BB(1)-BB(n). For the estimation of the SOC of each of the battery blocks, there can be appropriately used a method for estimating an SOC in a lithium ion battery. For example, with reference to an SOC-voltage characteristic 510 associated with battery voltage (in particular open circuit voltage) as shown in FIG. 12, the block SOCs can be sequentially calculated from battery voltage Vb for each constant cycle. Alternatively, the block SOC may be calculated in accordance with an integrated value of battery current Ib and battery temperature Tb in addition to battery voltage Vb. It should be noted that with reference to SOC-voltage characteristic 510 shown in FIG. 12, the "state detection value" in the present embodiment at least includes the battery voltage (Vb).

Total SOC setting unit 315 generates a total SOC (SOC#) representing a state of stored charge (amount of stored charge) in the entire main battery 220 based on the block SOCs (BSOC(1)-BSOC(n)) respectively calculated by SOC estimating units 312(1)-312(n).

Each of SOC estimating units 312 and total SOC setting unit 315 is a functional block implemented by software processing performed by battery ECU 310 or hardware processing.

The following describes a method of setting the total SOC by means of total SOC setting unit 315.

Figure 4:
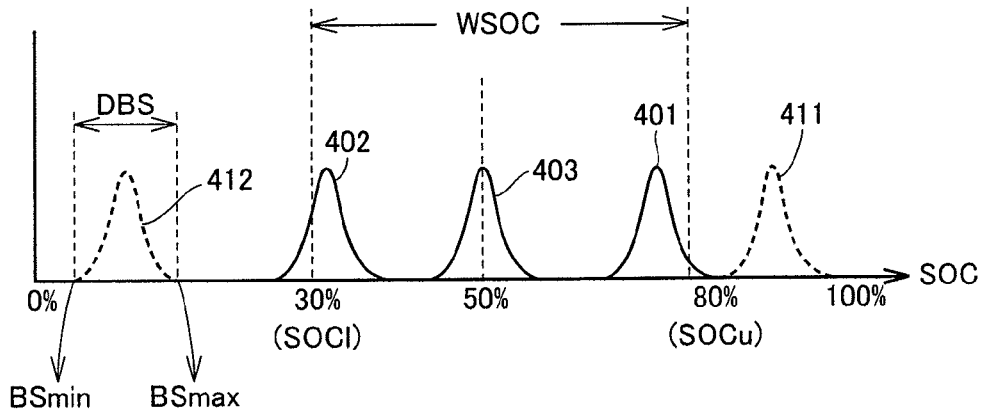
FIG. 4 is a conceptual view illustrating a relation between setting of a total SOC and distribution of block SOCs in the embodiment of the present invention.

FIG. 4 shows a conceptual view for setting the total SOC in the embodiment of the present invention.

Referring to FIG. 4, each of the block SOCs of battery blocks BB(1)-BB(n) is not uniform and has a certain distribution as described above. FIG. 4 shows distribution states 401-403, 411, 412 of such SOCs. In each of the distribution states, a value at the left end represents a minimum value BSmin among the block SOCs, whereas a value at the right end represents a maximum value BSmax among the block SOCs. Then, a variation amount DBS (hereinafter, also simply referred to as "SOC variation") at present in the block SOCs are defined in accordance with a difference between maximum value BSmax and minimum value BSmin.

In FIG. 4, as one example, a control lower limit value SOCl and a control upper limit value SOCu for SOC are set at 30(%) and 80(%) respectively. A range from SOCl to SOCu corresponds to a control range for SOC. The control range has a width, which is represented by an SOC control width WSOC. SOC control width WSOC is defined by WSOC=SOCu−SOCl. In the example of FIG. 4, WSOC=50(%).

In distribution state 401, maximum value BSmax is higher than control upper limit value SOCu. Accordingly, at least one battery block is charged to exceed the control upper limit value. If the battery blocks are further charged from this state, all the block SOCs will become higher than control upper limit value SOCu, which may lead to a distribution state 411 in which all the battery blocks are charged to exceed the control upper limit value. Thus, in distribution state 401, it is necessary to prevent the battery pack (main battery 220) from being further charged. In view of this, total SOC setting unit 315 sets the total SOC (SOC#) to be higher than control upper limit value SOCu. In response to this, charging power upper limit value Win is set to limit or prohibit charging of main battery 220, such as limit/prohibition of regenerative braking power generation.

In contrast, in distribution state 402, minimum value BSmin is lower than control lower limit value SOCl. Accordingly, at least one battery block is discharged to fall below the control lower limit value. If the battery blocks are further discharged from this state, all the block SOCs will become lower than control lower limit value SOCl, which may lead to a distribution state 412 in which all the battery blocks are discharged to fall below the control lower limit value. Thus, in distribution state 402, it is necessary to prevent the battery pack (main battery 210) from being further discharged. In view of this, total SOC setting unit 315 sets the total SOC (SOC#) to be lower than control lower limit value SOCl. In response to this, discharging power upper limit value Wout is set to limit or prohibit discharging of main battery 220, such as torque limitation of motor generator 140.

In distribution state 403 in which all the block SOCs fall within the control range (SOCl-SOCu), total SOC setting unit 315 sets the total SOC (SOC#) to fall within a range of not less than control lower limit value SOCl and not more than control upper limit value SOCu so as to indicate that the entire battery pack (main battery 220) is within the control range.

Figure 5:
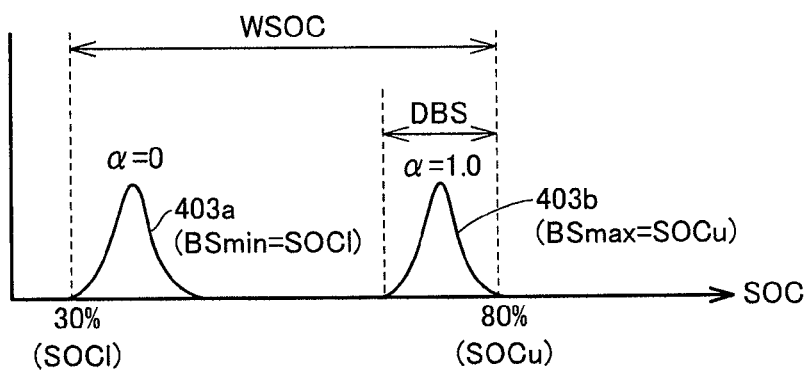
FIG. 5 is a conceptual view illustrating the setting of the total SOC when all the block SOCs are within a control range.

FIG. 5 shows a conceptual view illustrating the setting of the total SOC in distribution state 403 of FIG. 4, i.e., in the state in which all the block SOCs are within the control range.

In distribution state 403a, minimum value BSmin of the block SOCs=SOCl. Hence, minimum value BSmin corresponds to the discharging limit state in the control range. In contrast, in distribution state 403b, maximum value BSmax of the block SOCs=SOCu. Hence, maximum value BSmax corresponds to the charging limit state in the control range.

Accordingly, in distribution state 403a, total SOC setting unit 315 sets the total SOC (SOC#) at control lower limit value SOCl. On the other hand, in distribution state 403b, total SOC setting unit 315 sets the total SOC (SOC#) at control upper limit value SOCu.

Further, in an intermediate state between distribution states 403a and 403b, total SOC setting unit 315 makes the following setting: SOCl<SOC#<SOCu. On this occasion, the total SOC (SOC#) is set in accordance with a positional relation of the distribution of the block SOCs at present relative to the control range.

In particular, a parameter α is introduced to quantitatively indicate the positional relation of the block SOC distribution at present relative to a movable range for limiting the charging and discharging of the battery pack (main battery 220) to fall within the control range. Here, the "movable range" refers to a range from distribution state 403a to distribution state 403b in the course of charging, or a range from distribution state 403b to distribution state 403a in the course of discharging. Namely, the movable range can be represented by (WSOC−DBS). Parameter α is calculated by the following formula (1):

$$\alpha = (BSmax - (SOCu + DBS))/(WSOC - DBS) \quad (1)$$

In the formula (1), the block SOC distribution at present relative to the movable range is quantitatively evaluated in a reflection of the SOC variation among the battery blocks.

Total SOC setting unit 315 determines SOC variation DBS and maximum value BSmax from the respective block SOCs (BSOC(1)-BSOC(n)) of battery blocks BB(1)-BB(n), and calculates parameter α in accordance with the above-described formula (1). Further, total SOC setting unit 315 sets the total SOC (SOC#) in accordance with the following formula (2):

$$SOC\# = SOCl + WSOC \cdot \alpha \quad (2)$$

In distribution state 403a, α=0 is determined from the formula (1). Hence, it is understood that SOC#=SOCl is set from the formula (2). Meanwhile, in distribution state 403b, α=1.0 is determined from the formula (1). Hence, it is understood that SOC#=SOCu is set from the formula (2).

Further, in distribution state 401 of FIG. 4, α>1.0 is determined from the formula (1). Hence, it is understood that SOC#>SOCu is set from the formula (2).

Further, in distribution state 402 of FIG. 4, α<0 is determined from the formula (1). Hence, it is understood that SOC#<SOCl is set from the formula (2).

It should be noted that in the calculations by the formulae (1), (2), SOC#<0(%) or SOC#>100(%) may be determined depending on a value of DBS. However, this can be addressed by setting upper/lower limit guards in a range of 0(%)-100(%).

Figure 6:
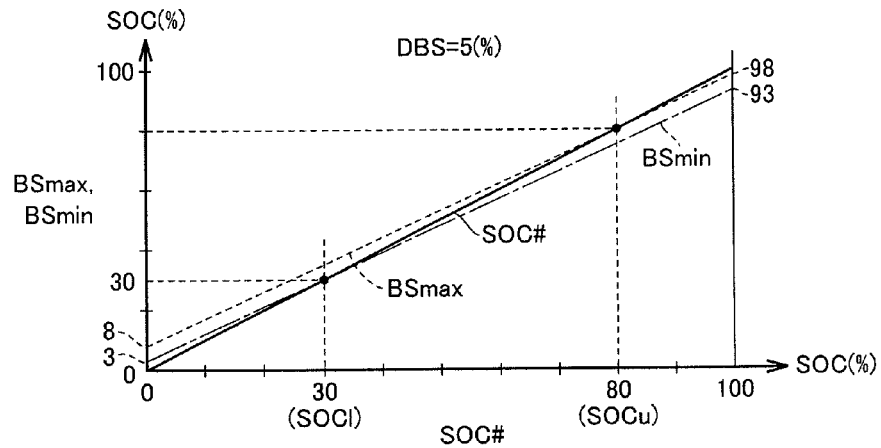
FIG. 6 is a first diagram showing exemplary setting of the total SOC by the charge state detecting device for the battery pack in the embodiment of the present invention.
Figure 7:
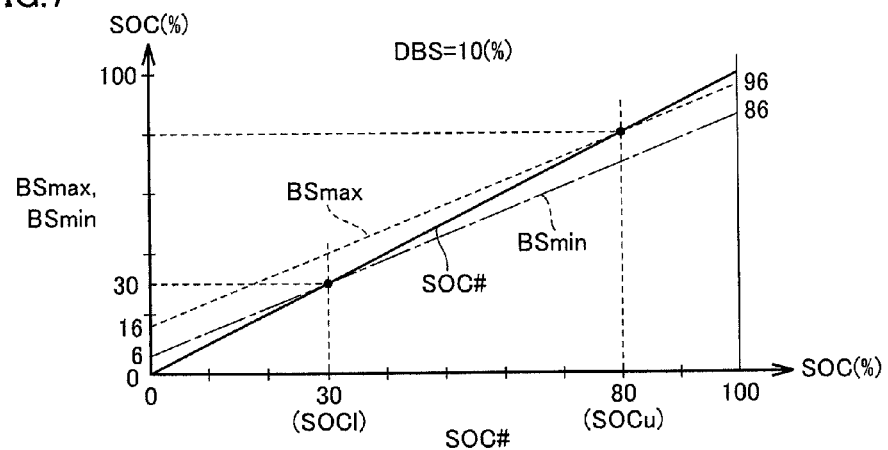
FIG. 7 is a second diagram showing exemplary setting of the total SOC by the charge state detecting device for the battery pack in the embodiment of the present invention.
Figure 8:
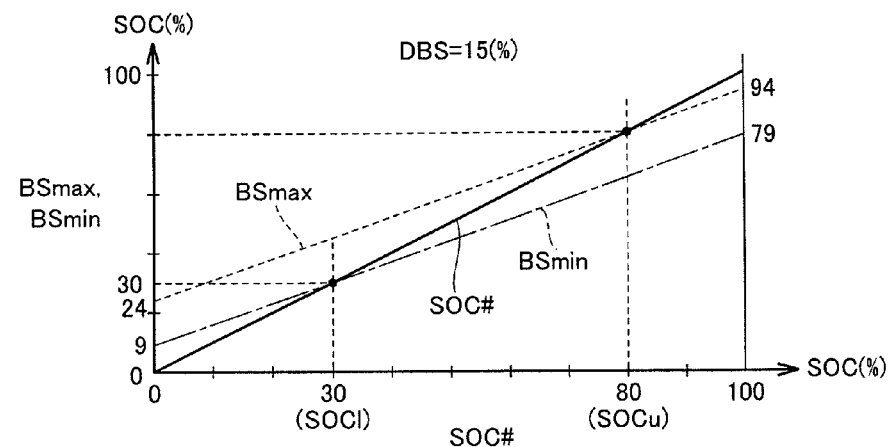
FIG. 8 is a third diagram showing exemplary setting of the total SOC by the charge state detecting device for the battery pack in the embodiment of the present invention.

FIG. 6 to FIG. 8 show calculation results of the total SOC (SOC#) relative to maximum values BSmax and minimum values BSmin of the block SOCs when variation amount DBS (DBS=BSmax−BSmin) is 5(%), 10(%), and 15(%). The calculation results are in accordance with the formulae (1), (2). Also in FIG. 6 to FIG. 8, it is assumed that exemplary numerical values are SOCl=30(%) and SOCu=80(%).

Referring to FIG. 6, in the case of DBS=5(%), SOC#=80(%) is set when BSmax=80(%). In the case where the battery pack is further charged from this state (case corresponding to charge state 401 of FIG. 4), SOC#>80(%) is set. Further, when BSmax=98(%) and BSmin=93(%), SOC# reaches 100(%). Likewise, when BSmin=30(%), SOC#=30(%) is set. In the case where the battery pack is further discharged from this state (case corresponding to charge state 402 of FIG. 4), SOC#<30(%) is set. When BSmax=8(%) and BSmin=3(%), SOC# is set at 0(%).

Referring to FIG. 7, also in the case of DBS=10(%), SOC#=80(%) is set when BSmax=80(%). When further charged until BSmax=96(%) and BSmin=86(%), SOC# reaches 100(%). Likewise, when BSmin=30(%), SOC#=30(%) is set. When further discharged until BSmax=16(%) and BSmin=6(%), SOC# is set at 0(%).

Referring to FIG. 8, also in the case of DBS=15(%), when BSmax=80(%), SOC#=80(%) is set. When further charged until BSmax=94(%) and BSmin=79(%), SOC# reaches 100

(%). Likewise, when BSmin=30(%), SOC#=30(%) is set. When further discharged until BSmax=24(%) and BSmin=9 (%), SOC# is set at 0(%).

From FIG. 6 to FIG. 8, it is understood that total SOC (SOC#) is set in accordance with a relation between the distribution state of the block SOCs and each of control upper and lower values SOCu, SOCl as shown in FIG. 4. Further, in accordance with the formulae (1), (2), as the SOC variation (DBS) among the battery blocks is larger, a degree of increase of the total SOC with respect to progress in charging and a degree of decrease of the total SOC with respect to progress in discharging are larger.

The following describes a problem taking place when the SOC variation among the battery blocks is increased as a result of use of main battery 220 (battery pack).

Figure 9:
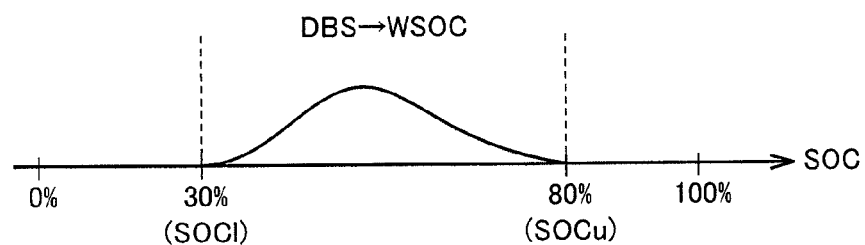
FIG. 9 is a conceptual view for illustrating a problem taking place when SOC variation among battery blocks is increased.

As shown in FIG. 9, it is considered that due to a factor such as increased temperature difference between battery blocks BB(1)-BB(n), SOC variation DBS comes closer to SOC control width WSOC as a result of continuous charging and discharging. In such a case, the denominator of the formula (1) becomes 0, with the result that the total SOC may not be able to be set.

Further, in the state of FIG. 9, the distribution of the block SOCs substantially conforms to the control range. Hence, it can be interpreted that the SOC of the entire main battery 220 has both the charging limit (control upper limit value) and the discharging limit (control lower limit value). Namely, what is mattered in such a state is which battery block's SOC is defined to be employed in setting the total SOC.

In the stored charge state detecting device for the battery pack in the present embodiment, the total SOC is defined to prevent overcharging when the SOC variation among the battery blocks becomes large, in view of a fact that the characteristics of a secondary battery such as a lithium ion battery are deteriorated more seriously during overcharging than those during overdischarging.

Namely, when SOC variation DBC becomes greater than a predetermined criteria value, total SOC setting unit 315 (FIG. 3) sets the total SOC (SOC#) in accordance with maximum value BSmax of the block SOCs (BSOC(1)-BSOC(n)) rather than the calculations with the formulae (1), (2). Representatively, SOC#=BSmax is set.

Here, the criteria value is set at a value slightly smaller than SOC control width WSOC, i.e., a value obtained by subtracting a predetermined margin from WSOC. In the example of FIG. 9 (WSOC=50(%)), the criteria value can be set at approximately 48(%).

Figure 10:
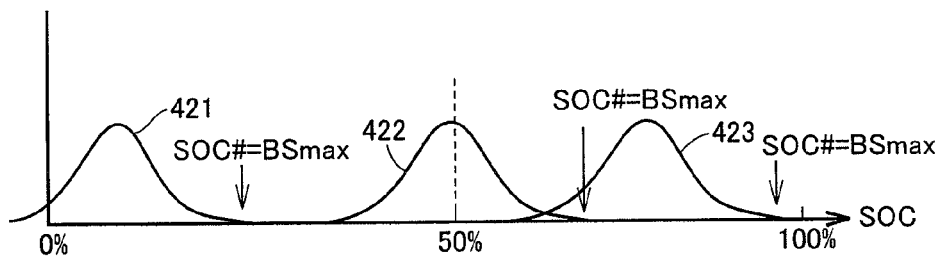
FIG. 10 is a conceptual view illustrating setting of the total SOC when the SOC variation is large.

Referring to FIG. 10, in each of distribution states 421-423 in which SOC variation DBC exceeds the criteria value, SOC#=BSmax is set. In other words, irrespective of BSmax and BSmin, the total SOC (SOC#) can be set in favor of the prevention of overcharging.

Figure 11:
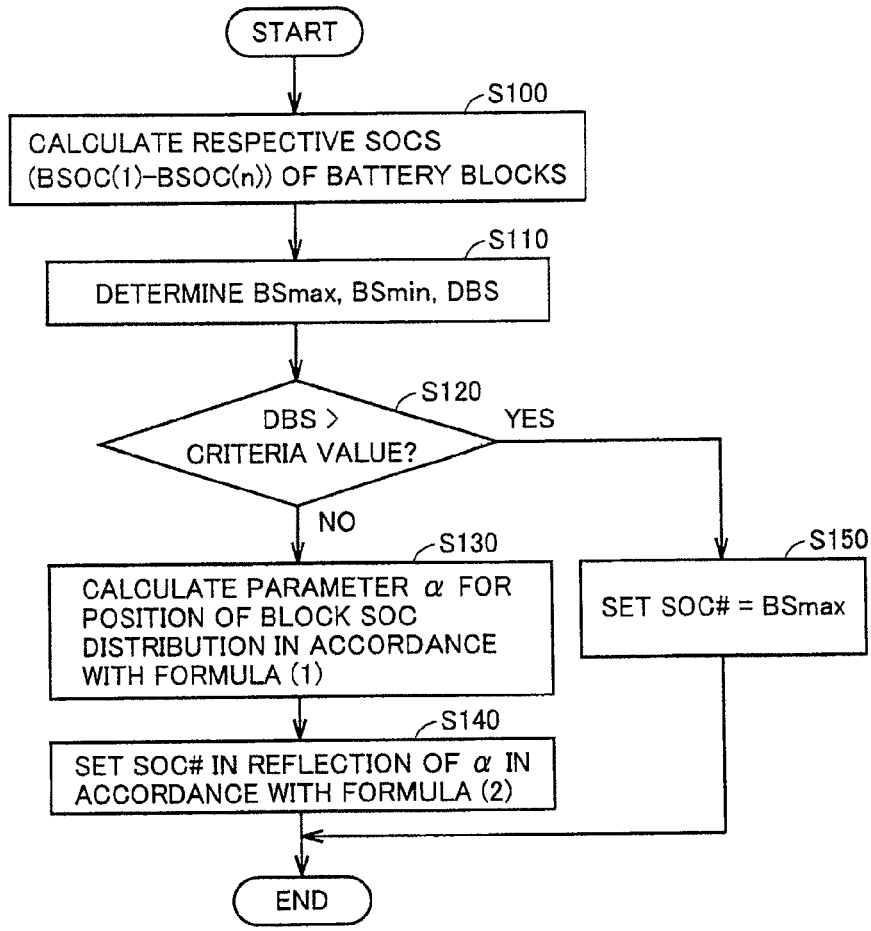
FIG. 11 is a flowchart showing a control processing procedure in the method for detecting the charge state of the battery pack in the embodiment of the present invention.

FIG. 11 shows a flowchart illustrating a control processing procedure in the method for detecting the stored charge state of the battery pack in the embodiment of the present invention. The control processing according to FIG. 11 is performed by battery ECU 310 for a predetermined cycle.

Referring to FIG. 11, in a step S100, battery ECU 310 calculates the respective block SOCs (BSOC(1)-BSOC(n)) of battery blocks BB(1)-BB(n) based on the state detection values of the battery blocks. Further, in a step S110, battery ECU 310 determines maximum value BSmax, minimum value BSmin, and SOC variation DBS (DBS=BSmax−BSmin) from the BSOC(1)-BSOC(n) of battery blocks BB(1)-BB(n) as determined in step S100.

Further, in a step S120, battery ECU 310 compares SOC variation DBS determined in step S110, with the predetermined criteria value. As described above, this criteria value is set at a value slightly smaller than SOC control width WSOC.

When DBS is larger than the criteria value (determined YES in S120), battery ECU 310 sets SOC#=BSmax in a step S150 as shown in FIG. 10. Namely, in this case, the setting of SOC# through the formulae (1) and (2) is not performed. On the other hand, when DBS≤the criteria value (determined NO in S120), in a step S130, battery ECU 310 calculates, in accordance with the formula (1), parameter α for quantitatively indicating the positional relation of the block SOC distribution at present relative to the movable range for restricting the charging and discharging of the battery pack (main battery 220) to fall within the control range. Moreover, in a step S140, in accordance with the formula (2), battery ECU 310 sets the total SOC (SOC#) in accordance with control lower limit value SOCl, SOC control width WSOC, and parameter α.

Through the control processing procedure shown in FIG. 11, the detection of the stored charge state for the battery pack can be implemented as illustrated in FIG. 4 to FIG. 10.

According to the charge state of the battery pack in the present embodiment, when the SOC of any of the battery blocks falls out of the control range (SOCl to SOCu), the total SOC of the entire battery pack can be set to exceed control upper limit value SOCu or fall below control lower limit value SOCl, based on the respective SOCs (block SOCs) of the plurality of battery blocks. In this way, the charging and discharging control can be performed to achieve safety against progress of further overcharging or overdischarging. Namely, the total SOC can be precisely set to prevent charging/discharging or overdischarging, in a reflection of the SOC variation among the battery blocks of the battery pack.

Further, when the SOC of each of the battery blocks is within the control range, the total SOC can be set within the control range from SOCl to SOCu so as to indicate that the SOC of the entire battery pack is within the normal SOC range.

Further, in the calculation for the total SOC through the formulae (1), (2), the total SOC can be set in accordance with parameter α and based on the block SOC distribution at present, so as to indicate the actual movable range at present relative to the control range. By thus setting the total SOC based on the movable range that is based on the detection value, the total SOC can be set to exhibit maximum performance of the battery pack without excessively narrowing the movable range by taking the SOC variation among the battery blocks into consideration too much.

Further, when the SOC variation among the battery blocks becomes large and the width of the control range and the SOC variation accordingly become substantially equal to each other, the total SOC of the battery pack can be set to prevent overcharging more preferentially, rather than the calculation of the total SOC through the formulae (1), (2).

It should be noted that in the present embodiment and variations thereof, a lithium ion battery is illustrated as the secondary battery constituting main battery 220, but a battery other than a lithium ion battery is also applicable to the setting of the total SOC in the embodiment of the present invention, as long as the battery is of a type having the characteristic indicated by reference character 510 shown in FIG. 12.

Further, in the present embodiment, the configuration of the load of the battery pack (main battery 220) of the electrically powered vehicle is not limited to the configuration shown in the figures, and can be any configuration inclusive of a configuration for generating vehicle driving force. Namely, the present invention can be commonly applied to electrically powered vehicles each having a motor configured to be driven by electric power from a secondary battery and to generate wheel driving force. The electrically powered vehicles include an electric vehicle and a fuel cell vehicle both having no engine, and a hybrid vehicle having an engine.

Alternatively, the present invention can be applied to a battery other than the secondary battery (battery pack) mounted on the electrically powered vehicles. Namely, the present invention can be commonly applied to detection of a charge state of a battery pack constituted by a secondary battery having such a characteristic that voltage is changed in a relatively uniform manner in response to a change of SOC, irrespective of a form of the load of the secondary battery.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The present invention is used to detect a charge state of an entire battery pack constituted by a secondary battery having such a characteristic that voltage is changed in a relatively uniform manner in response to a change of SOC.

REFERENCE SIGNS LIST

100: hybrid vehicle; 120: engine; 140, 140A, 140B: motor generator; 160: driving wheel; 180: speed reducer; 190: power split mechanism; 220: main battery; 221: battery cell; 222: current sensor; 224, 224(1)-224($n$): group of sensors; 240, 241: inverter; 242: converter; 280: engine ECU; 300: MG_ECU; 310: battery ECU; 312(1)-312($n$): SOC estimating unit (for each battery block); 315: total SOC setting unit; 320: HV_ECU; 401-403, 403$a$, 403$b$, 411, 412, 421-423: distribution state (block SOC); 410: accelerator pedal 415: accelerator pedal sensor; 420: brake pedal; 425: brake pedal sensor; 450: brake actuator; 460: brake mechanism; 465: disc rotor; 500, 510: SOC-voltage characteristic; BSmax: maximum value (block SOC); BSmin: minimum value (block SOC); DBS: variation amount (block SOC); Ib: battery current; SOC#: total SOC (battery pack); SOCl: SOC control lower limit value; SOCu: SOC control upper limit value; Tb, Tb(1)-Tb(n): battery temperature; Vb, Vb(1)-Vb(n): battery voltage; Win: charging power upper limit value; Wout: discharging power upper limit value; WSOC: SOC control width.

The invention claimed is:

1. A charge state detecting device for a battery pack having a plurality of battery cells connected to one another in series, said plurality of battery cells being divided into a plurality of battery blocks each having at least one battery cell, the charge state detecting device comprising:
a stored charge amount estimating unit configured to calculate a plurality of stored charge amount estimate values respectively corresponding to said plurality of battery blocks, based on respective state detection values at said plurality of battery blocks; and
a total stored charge amount setting out unit configured to set a total stored charge amount estimate value of the battery pack based on said plurality of stored charge amount estimate values,
said total stored charge amount setting unit being configured to:
set said total stored charge amount estimate value to be higher than a control upper limit value in a first case where a maximum value of said plurality of stored charge amount estimate values is higher than said control upper limit value; set said total stored charge amount estimate value to be lower than a control lower limit value in a second case where a minimum value of said plurality of stored charge amount estimate values is lower than said control lower limit value; and set said total stored charge amount estimate value at a value within a control range defined to be not less than said control lower limit value and not more than said control upper limit value, based on a distribution of said plurality of stored charge amount estimate values at present in a third case where all of said plurality of stored charge amount estimate values are within said control range,
said total stored charge amount setting unit being configured to calculate a variation amount in accordance with a difference between said maximum value and said minimum value and being configured to determine a parameter in accordance with a ratio of a second value to a first value, said first value being obtained by subtracting said variation amount from a control width representing a width of said control range, said second value being obtained by subtracting said variation amount and said control lower limit value from said maximum value, said parameter indicating where said plurality of stored charge amount estimate values at present are located in said control range, said total stored charge amount setting unit being configured to set said total stored charge amount estimate value in accordance with a total of a multiplication value of said parameter and said control width and said control lower limit value.

2. The charge state detecting device for the battery pack according to claim 1, wherein in said third case, said total stored charge amount setting unit is configured to set said total stored charge amount estimate value at said control lower limit value in a case where said minimum value is equal to said control lower limit value, and set said total stored charge amount estimate value at said control upper limit value in a case where said maximum value is equal to said control upper limit value.

3. The charge state detecting device for the battery pack according to claim 1, wherein said total stored charge amount setting unit is configured to set said total stored charge amount estimate value in accordance with said maximum value when a variation amount according to a difference between said maximum value and said minimum value is larger than a predetermined value.

4. The charge state detecting device for the battery pack according to claim 3, wherein said predetermined value is set at a value obtained by subtracting a predetermined safety margin from a control width representing a width of said control range.

5. A method for detecting a charge state of a battery pack having a plurality of battery cells connected to one another in series,
said plurality of battery cells being divided into a plurality of battery blocks each having at least one battery cell,
the method for detecting the charge state comprising the steps of:
calculating a plurality of stored charge amount estimate values respectively corresponding to said plurality of battery blocks, based on respective state detection values at said plurality of battery blocks;

determining a maximum value and a minimum value of said plurality of stored charge amount estimate values; and setting a total stored charge amount estimate value of the battery pack based on said plurality of stored charge amount estimate values, in the step of setting, said total stored charge amount estimate value being set to be higher than a control upper limit value in a first case where said maximum value is higher than said control upper limit value, said total stored charge amount estimate value being set to be lower than a control lower limit value in a second case where said minimum value is lower than said control lower limit value, and said total stored charge amount estimate value being set at a value within a control range defined to be not less than said control lower limit value and not more than said control upper limit value, based on a distribution of said plurality of stored charge amount estimate values at present in a third case where all of said plurality of stored charge amount estimate values are within said control range, the step of determining further determining a variation amount in accordance with a difference between said maximum value and said minimum value, the step of setting including the steps of determining a parameter in accordance with a ratio of a second value to a first value, said first value being obtained by subtracting said variation amount from a control width representing a width of said control range, said second value being obtained by subtracting said variation amount and said control lower limit value from said maximum value, said parameter indicating where said plurality of stored charge amount estimate values at present are located in said control range, and calculating said total stored charge amount estimate value in accordance with a total of a multiplication value of said parameter and said control width and said control lower limit value.

6. The method for detecting the charge state of the battery pack according to claim 5, wherein in said third case, the step of setting sets said total stored charge amount estimate value at said control lower limit value in a case where said minimum value is equal to said control lower limit value, and sets said total stored charge amount estimate value at said control upper limit value in a case where said maximum value is equal to said control upper limit value.

7. The method for detecting the charge state of the battery pack according to claim 5, wherein, the step of determining further determines a variation amount in accordance with a difference between said maximum value and said minimum value, the method for detecting the charge state further comprising the step of setting said total stored charge amount estimate value in accordance with said maximum value when said variation amount is larger than a predetermined value.

8. The method for detecting the charge state of the battery pack according to claim 7, wherein said predetermined value is set at a value obtained by subtracting a predetermined safety margin from a control width representing a width of said control range.

* * * * *